(12) United States Patent
Liu et al.

(10) Patent No.: US 8,724,765 B2
(45) Date of Patent: May 13, 2014

(54) LOCKING SYSTEM AND METHOD THEREOF

(75) Inventors: Yongbo Liu, Shenzhen (CN); Hongwei Zhang, Shenzhen (CN); Jian Li, Shenzhen (CN); Zhaoli Zhang, Shenzhen (CN); Liang Fan, Shenzhen (CN); Zhen Liu, Shenzhen (CN); Yutao Jia, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 164 days.

(21) Appl. No.: 13/502,477

(22) PCT Filed: Oct. 22, 2010

(86) PCT No.: PCT/CN2010/078003
§ 371 (c)(1),
(2), (4) Date: Apr. 17, 2012

(87) PCT Pub. No.: WO2011/050693
PCT Pub. Date: May 5, 2011

(65) Prior Publication Data
US 2012/0213268 A1    Aug. 23, 2012

(30) Foreign Application Priority Data
Oct. 23, 2009    (CN) .......................... 2009 1 0207117

(51) Int. Cl.
*H03D 3/24*    (2006.01)
(52) U.S. Cl.
USPC ........... 375/376; 375/373; 375/371; 375/354; 331/16; 331/18

(58) Field of Classification Search
USPC ............... 375/376, 373, 371, 354; 331/16, 18
See application file for complete search history.

(56) References Cited

U.S. PATENT DOCUMENTS 6,970,046 B2    11/2005    Da Dalt et al.
7,940,129 B1 *    5/2011    Tsang et al. .................... 331/17
(Continued)

FOREIGN PATENT DOCUMENTS

CN    1377156 A    10/2002
CN    2886922 Y    4/2007
(Continued)

OTHER PUBLICATIONS

International Search Report for PCT/CN2010/078003 dated Jan. 4, 2011.

*Primary Examiner* — Zewdu Kassa
(74) *Attorney, Agent, or Firm* — Ling Wu; Stephen Yang; Ling and Yang Intellectual Property (57) ABSTRACT

The present invention provides a locking method and system, and the method includes: a locking system performing a phase discrimination and conversion process to an input signal $F_i$ of an external standard source and a feedback output signal $F_0$ of a local thermostatic crystal oscillator which pass through a frequency division, to generate a clock signal clk and a signal sign which is used to denote a frequency size relationship between the signal $F_i$ and the signal $F_0$, and performing a filtering process to the signal clk and the signal sign, and performing a voltage controlled oscillation process to a signal ahead used to denote that the frequency of the signal $F_0$ is lower than the frequency of the signal $F_i$ and a signal lag used to denote that the frequency of the signal $F_0$ is higher than the frequency of the signal $F_i$, to implement a locking of the signal $F_0$ and the signal $F_i$.

8 Claims, 4 Drawing Sheets

(56) References Cited

U.S. PATENT DOCUMENTS

| | | | |
|---|---|---|---|
| 2002/0136341 A1* | 9/2002 | Huh et al. | 375/376 |
| 2003/0086339 A1 | 5/2003 | Dally et al. | |
| 2005/0046452 A1* | 3/2005 | Briones | 327/156 |
| 2009/0085621 A1 | 4/2009 | Liu et al. | |
| 2009/0251225 A1* | 10/2009 | Chen et al. | 331/1 A |

FOREIGN PATENT DOCUMENTS

| | | |
|---|---|---|
| CN | 201298839 Y | 8/2009 |
| CN | 101694998 A | 4/2010 |

* cited by examiner

LOCKING SYSTEM AND METHOD THEREOF

TECHNICAL FIELD

The present invention relates to fields of communication, navigation and spectrum measurement and so on, and particularly, to a locking system and method.

BACKGROUND OF THE RELATED ART

With a fast development of the electronic technology, fields of communication, navigation, astronautics, measurement and control, high precision measurement and mobile phone and the like have increasingly demands on some indexes, such as short-term stability, long-term stability and aging rate and so on, of a frequency source. Nowadays, with the rapid development of modern communication technology, various communication systems also have increasingly demand on synchronization of time and frequency. Now many frequency outputs with high stability, high accuracy and good aging rate are implemented by using a highly precise phase-locked loop. The fast, highly precise lock of a local output frequency and a nominal frequency can be implemented by using the high precise phase-locked loop. The phase-locked can make each frequency index of a local source in which one of frequency indexes is lower than that of a standard source obtain obvious improvement. Lock speed and precision of the phase-locked loop are a basis on which we measure the indexes of the phase-locked loop. First, the locking precision of the phase-locked loop must be high enough, the higher the phase-locked precision is, the less the frequency difference between the locked source and the standard source is during the frequency locking, and thus the synchronization between systems are implemented more easily. Second, the phase-locked loop must be able to implement the fast locking, the faster the locking speed of the phase-locked loop is, the faster the implementation of locking between the locked source and the standard source is, and the faster the implementation of frequency synchronization between frequency sources of the communication system is, the faster tracking the locked source can be to implement the synchronization.

The phase-locked loop circuit can improve the short-term stability and frequency output precision of the output frequency of the local source, in particular, improvement of the long-term stability thereof is especially obvious. In the fields such as navigation and the like, the phase-locked loop can make a local thermostatic crystal oscillator keep a good short-term stability, and the long-term stability of the local thermostatic crystal oscillator can be basically maintain at the level of an atomic lock in the navigation system because the local thermostatic crystal oscillator keeps the synchronization with the atomic clock in the navigation system all the time. Thus, not only the good short-term stability of the thermostatic crystal oscillator can be maintained, but also the thermostatic crystal oscillator can obtain the better long-term stability which is close to the level of the atomic lock because of locking. Because of locking with the atomic lock, the short-term stability of the thermostatic crystal oscillator can also be improved to a certain degree.

Figure 1:
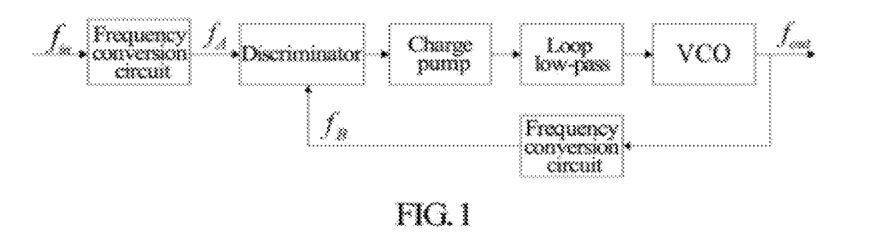
FIG. 1 is a schematic diagram of a principle of a traditional phase-locked loop.

The traditional PLL (phase-locked loop) makes signals $f_{in}$ and $f_{out}$ pass through a complicated frequency conversion circuit by using a frequency divider, converts the signals $f_{in}$ and $f_{out}$ into the same lower frequency signals and then performs a phase discrimination, the principle of which is shown in FIG. 1.

The current phase-locked loop is mainly ranged into two types: an analog phase-locked loop and a digital phase-locked loop. The analog phase-locked loop is the phase-locked loop which is widely applied at the earliest, which has the feature of high phase-locked precision. A low-pass filter and a voltage-controlled oscillator of the analog phase-locked loop circuit are all analog circuits, with disadvantages such as charge drift, components easy to aging, parameters instability.

Before the digital phase-locked loop does not appear, the analog phase-locked loop is widely applied in various fields because of its high phase-locked precision. Nowadays, with a rapid development of digital circuits, more and more fields use the digital circuits, and it can be said that the digital circuits are applied almost everywhere. In some digital circuits, the analog circuit is required to be performed a corresponding digital conversion process when the analog phase-locked loop is used to lock some digital signals, which will increase the complexity of the phase-locked loop circuit, therefore, applications of the analog phase-locked loop in some digital circuits are limited.

The digital phase-locked loop can be applied in the modern digital circuit directly, and the digital signal need not to be firstly converted into the analog signal and then locked by using the analog phase-locked loop. However, the traditional digital phase-locked loop also exists some problems in the following:

1) Long locking time, the traditional digital phase-locked loop controls the thermostatic crystal oscillator by adopting a signal which is frequency-divided at first and then passes a filter using a phase error; it can be seen from a loop formula of the phase-locked loop that, a phase-locked process of the traditional phase-locked loop is an oscillation convergence process, and the locking time is longer because a repetitive process of convergence exists;

2) Phase-locked precision is not high enough; for a full digital phase-locked loop implemented by using a DDS (Direct Digital Synthesizer), the phase-locked precision is not high enough because the phase-locked precision is affected by DDS resolution.

In conclusion, the phase-locked loop is more and more widely applied in the fields such as SDH (Synchronous Digital Hierarchy) communication, navigation and high precision measurement, and so on. Particularly, for the high precision communication field that requires the frequency output of the local source to be consistent with the frequency output of the standard source rapidly, such as the SDH communication, it not only requires to be able to implement the fast locking between the local source and the standard source, but also requires to be able to implement the fast high precise and fast locking

SUMMARY OF THE INVENTION

The present invention provides a locking system and method, substantially increasing the locking speed of the phase-locked and significantly increasing phase-locked precision.

In order to solve the above problem, a locking system is disclosed in the present invention, and the system comprises a digital phase discrimination and conversion unit, a digital loop filter unit and a digital voltage controlled oscillation unit which are connected in turn, wherein:

the digital phase discrimination and conversion unit is configured to perform a phase discrimination and conversion process to an input signal $F_I$ of an external standard source and a feedback output signal $F_O$ of a local thermostatic crystal oscillator which pass through a frequency division, to generate a clock signal clk and a signal sign which is used to denote a frequency size relationship between the signal $F_i$ and the signal $F_O$;

the digital loop filter unit is configured to perform a filtering process to the signal clk and the signal sign, and generate a signal ahead which is used to denote that the frequency of the signal $F_O$ is lower than the frequency of the signal $F_i$ and a signal lag which is used to denote that the frequency of the signal $F_O$ is higher than the frequency of the signal $F_i$;

the digital voltage controlled oscillation unit is configured to perform a voltage controlled oscillation process for the signal ahead and the signal lag which are generated after the filtering process, to implement a locking of the signal $F_O$ and the signal $F_i$.

The digital phase discrimination and conversion unit may comprise a digital stagger phase discriminator and a conversion module, wherein, the digital stagger phase discriminator may be configured to perform a phase discrimination process to the signal $F_i$ and the signal $F_O$, and generate a pulse signal error which is used to denote a phase relationship between the signal $F_i$ and the signal $F_O$; the conversion module may be configured to calculate a pulse width of the pulse signal error according to a counting signal count, and generate the signal sign which denotes the frequency size relationship between the signal $F_i$ and the signal $F_O$ and a signal equ_nequ which denotes whether neighboring pulse widths are equal, and perform an AND process to the signal equ_nequ and the signal $F_i$ to generate the clock signal clk; the counting signal count may be implemented by way of a time interval calculation, and the signal sign may denote the frequency size relationship between the signal $F_i$ and the signal $F_O$ by a size relationship of neighboring pulse widths in the pulse signal error.

The digital voltage controlled oscillation unit may comprise a Digital-Analog (DA) converter and a digital voltage controlled oscillator; the DA converter may be configured to receive the signals ahead and lag output by the digital loop filter unit, and after performing a digital-analog conversion by controlling the DA converter using the received signals, transmit the converted signals to the digital voltage controlled oscillator; the digital voltage controlled oscillator may be configured to perform the voltage controlled oscillation process to the signals transmitted by the DA converter.

Or, the digital voltage oscillation unit may comprise a pulse width modulation (PWM) module and a digital voltage controlled oscillator; the PWM module may be configured to, generate a PWM wave with a constant period and an adjustable high-level pulse width, and perform a pulse width modulation to the PWM wave by using the signals ahead and lag output by the digital loop filter unit, and transmit the signal after the pulse width modulation to the digital voltage controlled oscillator; the digital voltage controlled oscillator may be configured to perform the voltage controlled oscillation process to the signal transmitted by the PWM module. The PWM module may be implemented by timing setting a processor of a field programmable gate array or a programmable logic device in the locking system.

A locking method is disclosed in the present invention, comprising:

a locking system performing a phase discrimination and conversion process to an input signal $F_i$ of an external standard source and a feedback output signal $F_O$ of a local thermostatic crystal oscillator which pass through a frequency division, to generate a clock signal clk and a signal sign which is used to denote a frequency size relationship between the signal $F_i$ and the signal $F_O$, and performing a filtering process to the signal clk and the signal sign, and performing a voltage controlled oscillation process to a signal ahead which is used to denote that the frequency of the signal $F_O$ is lower than the frequency of the signal $F_i$ and a signal lag which is used to denote that the frequency of the signal $F_O$ is higher than the frequency of the signal $F_i$, to implement a locking of the signal $F_O$ and the signal $F_i$.

In the above method, the step of the locking system performing the phase discrimination and conversion process to the signal $F_i$ and the signal $F_O$ which pass through the frequency division to generate the clock signal clk and the signal sign which is used to denote the frequency size relationship between the signal $F_i$ and the signal $F_O$ may comprise: the locking system performing a phase discrimination process to the signal $F_i$ and the signal $F_O$ at first, generating a pulse signal error which is used to denote a phase relationship between the signal $F_i$ and the signal $F_O$, calculating a pulse width of the pulse signal error according to a counting signal count, generating the signal sign which denotes the frequency size relationship between the signal $F_i$ and the signal $F_O$ and a signal equ_nequ which denotes whether neighboring pulse widths are equal, and performing an AND process to the signal equ_nequ and the signal $F_i$ to generate the clock signal clk; wherein, the counting signal count may be implemented by way of a time interval calculation, and the signal sign may denote the frequency size relationship between the signal $F_i$ and the signal $F_O$ by a size relationship of neighboring pulse widths in the pulse signal error.

The locking system may control a digital-analog conversion by using the signals ahead and lag which are generated after the filtering process, and then perform the voltage controlled oscillation process.

Or, the locking may perform a pulse width modulation to the pulse width modulation (PWM) wave by using the signals ahead and lag which are generated after the filtering process, and then perform the voltage controlled oscillation process. The PWM wave may be a PWM wave with a constant period and an adjustable high-level pulse width, which is generated by timing setting a processor of a field programmable gate array or a programmable logic device in the locking system.

The technical scheme of the present invention avoids an oscillation convergence process of a traditional phase-locked loop in a locking process, thereby a fast and high precise locking can be implemented. In addition, the technical scheme of the present invention reduces the circuit area and reduces the circuit cost.

PREFERRED EMBODIMENTS OF THE PRESENT INVENTION

The main conception of the present invention is that, a full digital phase-locked loop can be implemented by adopting a digital phase discrimination and conversion unit, a digital loop filter unit and a digital voltage controlled oscillating unit, thereby a fast locking is implemented; wherein, the digital phase discrimination and conversion unit can directly determine a size relationship between a frequency of a local output signal and a nominal frequency to avoiding an oscillation convergence process of the traditional phase-locked loop in a locking process, and an improved digital circuit in the digital phase discrimination and conversion unit can be integrated into an FPGA (field programmable gate array) or a CPLD (complex programmable logic device). In addition, in order to implement a high precise phase-locked loop, the digital voltage controlled oscillation unit can perform a digital-analog conversion to the digital signal firstly by a DA (digital-analog converter) or a pulse width modulation (PWM) module, and then perform a voltage controlled oscillation process.

The technical scheme of the present invention will be illustrated in detail in combination with the accompanying drawings and specific embodiments as follows.

Embodiment 1

Figure 2:
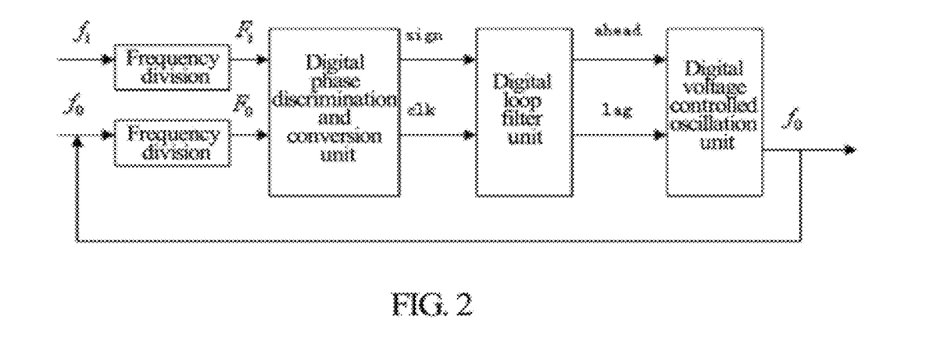
FIG. 2 is a schematic diagram of a phase-locked loop proposed in an embodiment 1.

A fast and high precise locking system, a structure of which is shown in FIG. 2, comprises at least a digital phase discrimination and conversion unit, a digital loop filter unit and a digital voltage controlled oscillation unit which are connected in turn.

The specific functions of each part will be introduced as follows.

Figure 4:
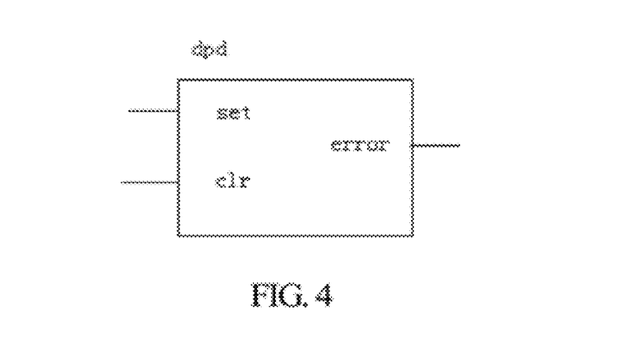
FIG. 4 is a schematic diagram of an interface of a digital stagger phase discriminator in an embodiment 1.
Figure 5:
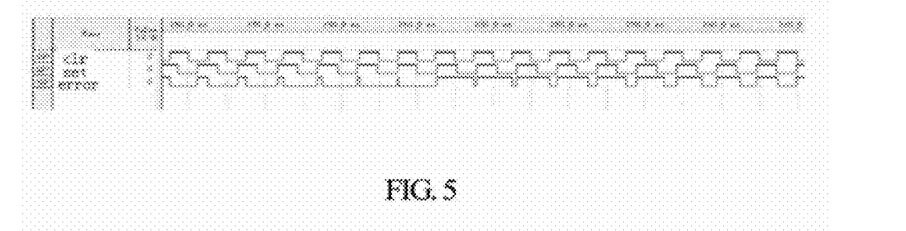
FIG. 5 is a simulation waveform diagram of output signals of a digital stagger phase discriminator in an embodiment 1.

The digital phase discrimination and conversion unit is configured to perform a phase discrimination and conversion process to an input signal $F_i$ of an external standard source and a feedback output signal $F_0$ of a local thermostatic crystal oscillator which pass through a frequency division, to generate a clock signal clk and a signal sign which is used to denote a frequency size relationship between the signal $F_i$ and the signal $F_0$;

in this embodiment, the digital phase discrimination and conversion unit can further comprise a digital stagger phase discriminator (DPD) and a conversion module;

wherein, the DPD can perform the phase discrimination to the input signal $F_i$ and $F_0$, to display a phase relationship between the signal $F_i$ and the signal $F_0$, i.e., to display whether the phase of the signal $F_0$ is lag or lead relative to the phase of the signal $F_i$, and the lagging or leading time, as shown in FIG. 5; specifically, the signals $F_0$ and $F_i$ are respectively connected to ports clr and set of the digital stagger discriminator as shown in FIG. 4, the output signal is a pulse width error signal error of the two input signals, and this signal error denotes the phase relationship between the signal $F_i$ and the signal $F_0$.

Figure 6:
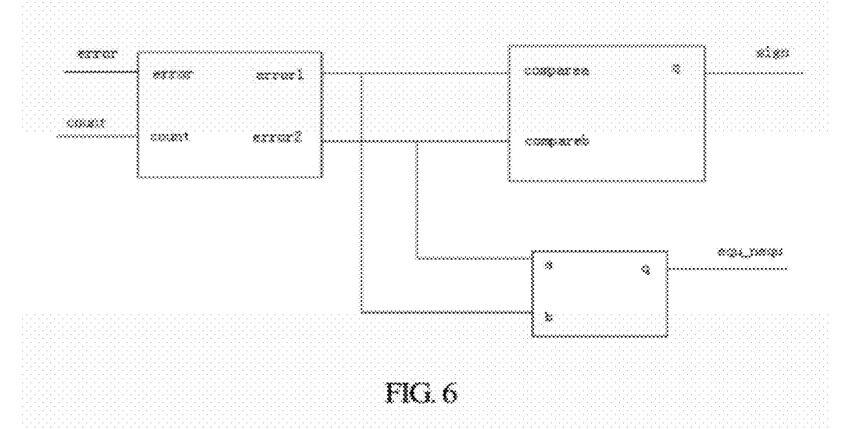
FIG. 6 is a part of a circuit diagram of a conversion module in a digital phase discrimination and conversion unit in an embodiment 1.
Figure 7:
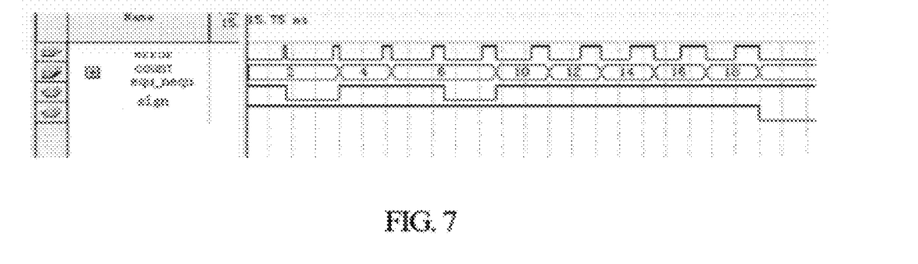
FIG. 7 is a simulation waveform diagram of output signals of a digital phase discrimination and conversion unit in an embodiment 1.

The converting module can perform a logical judgment to the output signal of the DPD, to obtain a frequency size relationship between the two input signals $F_i$ and $F_0$ of the phase-locked loop. The module can output a signal equ_nequ which denotes whether neighboring pulse widths are equal and a signal sign which denotes the size relationship between two neighboring pulse widths (i.e., a signal which is used to denote the frequency size relationship between the signal $F_i$ and the signal $F_0$) by using the signal error generated by the DPD and a counting signal count generated by a TDC (time interval calculation mode). A clock signal clk for controlling a DLF can be obtained by the equ_nequ and the $F_i$ passing an AND gate, and the signal clk is an input clock signal of a random walk filter. The signal clk performs a responding addition and subtraction counting to a internal counting unit of the random walk filter according to the signal sign when the equ_nequ is not equal to 0 (i.e., when frequencies of the two input signals in the locking system are not equal); wherein, FIG. 6 shows a circuit diagram used to generate the signal sign and the signal equ_nequ in the conversion module, thereby performing a comparison to the pulse widths of neighboring error signals to generate the signal sign. Herein, a sampling counting is performed to the error signal generated by the DPD by using a high-speed clock; the wider the error signal is (i.e., the greater the pulse width is), the greater the counting value is obtained, on the contrary, the smaller the error signal is (i.e., the smaller the pulse width is), the smaller the counting value is obtained, as shown in FIG. 5; while the counting signal count (i.e., a pulse width counting value of the error signal) can be implemented by using the TDC (time interval calculation). In this embodiment, simulation waveforms of output signals of the circuit as shown in FIG. 6 are shown in FIG. 7.

The digital loop filter unit can be implemented by a digital loop filter (DLF), which mainly performs a filtering process to signals output from the digital phase discrimination and conversion unit, i.e., filters some accidental factors, for purpose of digital filtering; that is, the digital loop filter unit can implement, according to the clock signal clk, controlling the loop filter to work when the two frequency signals $F_i$ and $F_0$ are not equal, and then generates signals ahead and lag which control the digital voltage controlled oscillation unit.

Figure 8:
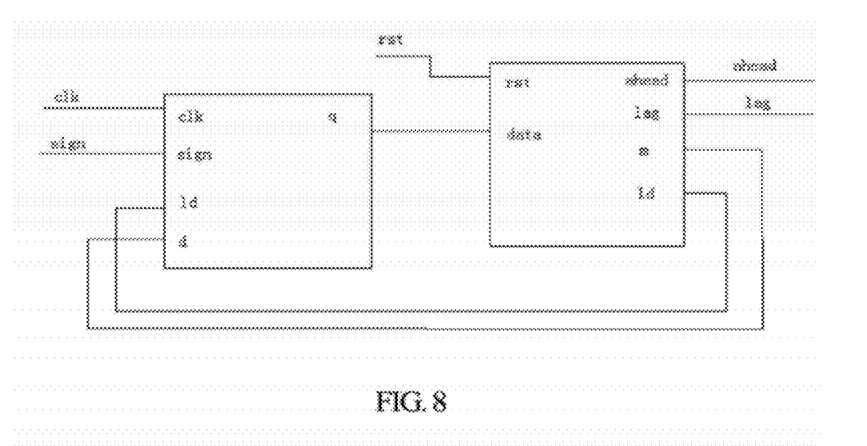
FIG. 8 is a schematic diagram of a DLF in an embodiment 1.
Figure 9:
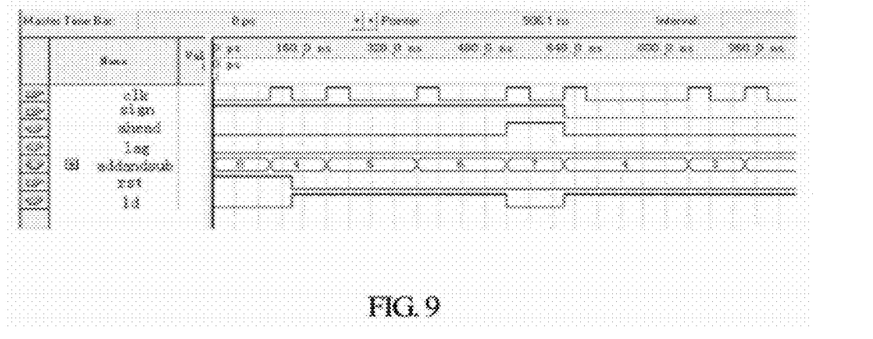
FIG. 9 is a simulation waveform diagram of output signals of a DLF shown in FIG. 8.

In this embodiment, the DLF adopts the random walk filter, the structure of which is shown in FIG. 8, and the DLF comprises an up/down counter (U/D_CNT) and a comparator (CMP); the clock signal adopts the output clk of the phase discriminator unit, the up or down counting direction is determined by the output sign of a triggered phase discriminator, and when the sign is a high level, the counter accumulates by "up", on the contrary, the counter accumulates by "down". An initial value d[3 . . . 0] of the counter is loaded by the comparator, when an output q[3 . . . 0] of the counter is up to m+k or m−k, the comparator generates a loading signal 1d (being valid at low level), m is loaded to the initial value d[3 . . . 0] of the counter, and meanwhile a lead/lag control signal ahead=1 (when q[3 . . . 0]=m+k), lag=1 (when q[3 . . . 0]=m−k) is output, wherein k is a filter factor. The random walk filter plays an important role in a loop, which can filter wrong edge detection pulses and lead/lag pulses causing by burr generated in transmission. In addition, the greater the k value is selected, the better the filtering effect is, but it will reduce the locking speed of the whole loop; therefore, a more appropriate k value should be selected, and this value should neither be too large nor be too small, which needs to be determined by verifying experimentally. Wherein, a simulation waveform of the DLF is shown in FIG. 9, when k=3 is selected in the simulation waveform diagram, it can be seen from the diagram that the above filtering function can be implemented.

Figure 10:
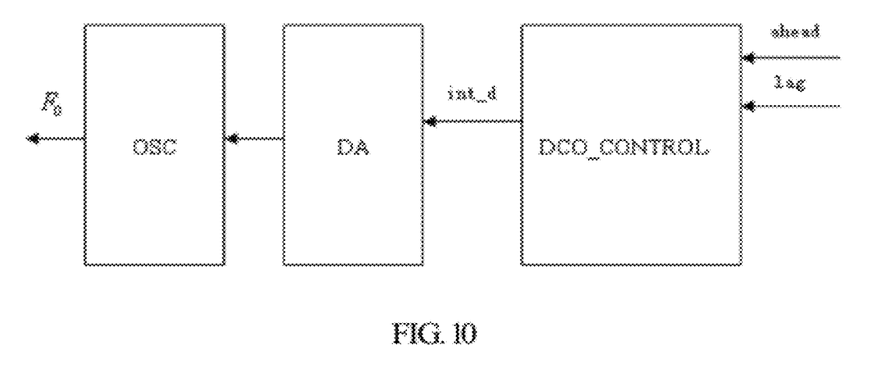
FIG. 10 is a schematic diagram of a DCO in an embodiment 1.

The digital voltage controlled oscillation unit is configured to perform a logical process to the signal ahead and the signal lag generated after the filtering process, to implement the locking of the signal $F_0$ and the signal $F_i$; specifically, the digital voltage controlled oscillation unit can further comprise a digital-analog (DA) converter and a digital voltage controlled oscillator (DCO), as shown in FIG. 10;

wherein, the digital-analog (DA) converter processes mainly for an increasing/decreasing signal output by the digital loop filter unit, and the increasing/decreasing signal can control a voltage output signal of the DA converter to increase or decrease correspondingly, that is, when the signal ahead is valid, it is denoted that $F_0$ is less than $F_i$. At the moment, a phase controller changes an input value of the DA converter by increasing the value of int_d, then a voltage of the DA converter will increase correspondingly, thereby making an output frequency of the thermostatic crystal oscillator decrease, and thus $F_0$ is adjusted to be close to $F_i$; similarly, when the signal lag and the response clock signal are valid, the input value of the DA converter decreases.

Figure 3:
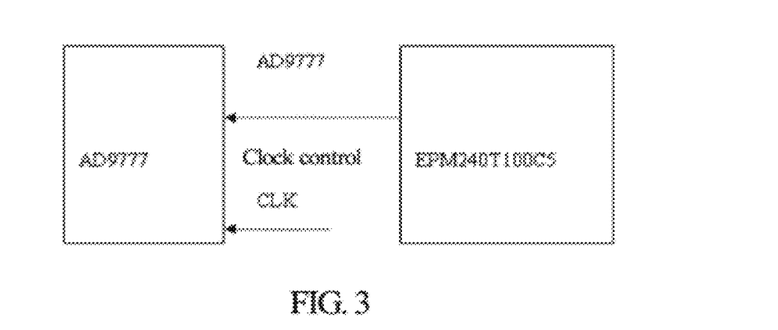
FIG. 3 is a principle block diagram of a connection between a DA converter and a CPLD in an embodiment 1.

The DA converter adopted in this embodiment is AD9777, which is a high-speed digital-analog converter with a conversion rate up to 400 MSPS, and has many advantages such as the high speed, low power consumption, and so on. FIG. 3 shows a schematic diagram of a circuit of interfacing of the AD9777 and a CPLD, wherein, a DLF unit of the EPM240T100C5 outputs conversion control signals ahead and lag required by the AD9777, and the AD9777 increases or decreases the output voltage of the DA converter according to the control signals. While, a DA conversion time is controlled by a clock CLK, and the CLK is a high-speed sampling clock for counting error signals by using a TDC (time interval count) principle; a frequency of the clock CLK is selected as 10 MHz, and the clock CLK controls the conversion rate of the DA converter in this system.

The range of the output voltage of the DA converter is not same as the voltage controlled range required by the voltage controlled crystal oscillator, so an operational amplifier can be followed by the DA converter. The operational amplifier can ensure that the output voltage of the DA converter is converted into the voltage controlled range required by the digital voltage controlled oscillator.

The digital voltage controlled oscillator mainly performs a voltage controlled oscillation to a voltage output of the DA converter, thus increasing/decreasing of the voltage output of the DA converter reflecting to the crystal oscillator becomes increasing/decreasing of the output frequency of the thermostatic crystal oscillator. By a feedback control action of the loop, the locking of the thermostatic crystal oscillator and the standard frequency source can be achieved finally.

The working principle of the above locking system will be introduced as follows:

a local output frequency is denoted as $F_0$, while a nominal frequency is denoted as $F_i$. The digital phase discrimination and conversion unit compares rising edges of two input signals $F_i$ and $F_0$, to obtain a lead/lag signal sign and a pulse control signal clk for the digital loop filter unit; the digital loop filter unit performs a smoothing filtering to an error signal by using signals sign and clk, and generates a signal ahead which controls the input increasing and a signal lag which controls the input decreasing of the DA converter in the digital voltage controlled oscillation unit; thereby increasing or decreasing the input of the DA converter to control the increasing or decreasing of the voltage signal at the voltage controlled end of the DCO, so as to achieve the purpose of increasing or decreasing frequency of $F_0$. The locking of $F_i$ and $F_0$ can be implemented by a feedback adjustment of the whole loop finally.

Embodiment 2

The difference between this embodiment and embodiment 1 is only in that, the digital voltage controlled oscillation unit comprises a PWM module, functions implemented by the DA converter in the embodiment 1 are implemented by using a PWM wave.

Wherein, the PWM module can be implemented by using a built-in processor core of an FPGA (or a CPLD) of the locking system, that is, the processor core built in the FPGA (or the CPLD) outputs a PWM wave with a constant period and an adjustable high-level pulse width (i.e., an adjustable high-level duty ratio) by a timing action. The processor core built in the FPGA (or the CPLD) receives an increasing/decreasing signal output by the digital loop filter unit, and correspondingly increases and decreases the high-level width of the PWM wave according to the increasing/decreasing signal (that is, correspondingly increases or decreases the high-level duty ratio of the PWM wave according to the increasing/decreasing signal), the PWM wave output by the FPGA passes through an RC low-pass filter and then accesses to a voltage controlled input end of the digital voltage controlled oscillator; and the output voltage of the low-pass filter can be changed by change of the high-level pulse width of the PWM wave, and the voltage controlled end of the digital voltage controlled oscillation unit also changes correspondingly, to achieve the purpose of changing the thermostatic crystal oscillator, and make the locking of the frequency output of the thermostatic crystal oscillator and the standard source be implemented finally.

Adopting the embodiment 2 to implement the locking system can decrease the volume occupied by the system, and save the high precise DA converter which is relatively expensive. The built-in core in the FPGA is adopted in the embodiment 2, so portions of the discriminator, the digital loop filter and the PWM wave logic circuit in the phase-locked loop can be all integrated into the FPGA, thus saving complexity of peripheral circuits of the system and reducing area of circuits can be realized, and meanwhile the purposes of reducing cost can also be achieved.

It can be seen from the above embodiments that, the technical scheme of the present invention improves a stagger discriminator, and the improved stagger discriminator can directly judge the frequency size relationship of two input signals, avoiding an oscillation convergence process of the traditional phase-locked loop in the locking process, thereby a fast locking can be implemented. In addition, the high precise DA converter is used to connect to the thermostatic crystal oscillator in the embodiment 1, thereby a high precise locking can be implemented; and in the embodiment 2, the configuration processor in the FPGA is adopted to output the PWM wave, and then make the PWM wave passes through the low-pass filter, and the output voltage of the low-pass filter adds to the input end of the thermostatic crystal oscillator to implement a high precise locking, thus, resources in the FPGA are utilized directly, which can reduce the area of circuits and reduce the cost of circuits.

The above description is only preferred embodiments of the present invention, and is not used to limit the present invention. For those skilled in the art, the present invention can have various variations and changes. Any modification, equivalent, improvement, and the like, made within the spirit and principle of the present invention should be included in the protection scope of the present invention.

INDUSTRIAL APPLICABILITY

Compared with the related art, technical scheme of the present invention avoids an oscillation convergence process of a traditional phase-locked loop during a locking process; thereby a fast and high precise locking can be implemented. Moreover, the technical scheme of the present invention reduces the area of circuits and reduces the cost of circuits.

What is claimed is:

1. A locking system, comprising a digital phase discrimination and conversion unit, a digital loop filter unit and a digital voltage controlled oscillation unit which are connected in turn, wherein, the digital phase discrimination and conversion unit is configured to perform a phase discrimination and conversion process to an input signal $F_i$ of an external standard source and a feedback output signal $F_0$ of a local thermostatic crystal oscillator which pass through a frequency division, to generate a clock signal clk and a signal sign which is used to denote a frequency size relationship between the signal $F_i$ and the signal $F_0$;

the digital loop filter unit is configured to perform a filtering process to the signal clk and the signal sign, and generate a signal ahead which is used to denote that the frequency of the signal $F_0$ is lower than the frequency of the signal $F_i$ and a signal lag which is used to denote that the frequency of the signal $F_0$ is higher than the frequency of the signal $F_i$;

the digital voltage controlled oscillation unit is configured to perform a voltage controlled oscillation process for the signal ahead and the signal lag which are generated after the filtering process to the signal clk and the signal sign, to implement a locking of the signal $F_0$ and the signal $F_i$;

wherein the digital phase discrimination and conversion unit comprises a digital stagger phase discriminator and a conversion module, wherein, the digital stagger phase discriminator is configured to perform a phase discrimination process to the signal $F_i$ and the signal $F_0$, and generate a pulse signal error which is used to denote a phase relationship between the signal $F_i$ and the signal $F_0$;

the conversion module is configured to calculate a pulse width of the pulse signal error according to a counting signal count, and generate the signal sign which denotes the frequency size relationship between the signal $F_i$ and the signal $F_0$ and a signal equ_nequ which denotes whether neighboring pulse widths are equal, and perform an AND process to the signal equ_nequ and the signal $F_i$ to generate the clock signal clk;

wherein the counting signal count is implemented by way of a time interval calculation, and the signal sign denotes the frequency size relationship between the signal $F_i$ and the signal $F_0$ by a size relationship of neighboring pulse widths in the pulse signal error.

2. The system according to claim 1, wherein, the digital voltage controlled oscillation unit comprises a Digital-Analog (DA) converter and a digital voltage controlled oscillator, wherein, the DA converter is configured to receive the signals ahead and lag output by the digital loop filter unit, and after performing a digital-analog conversion by controlling the DA converter using the received signals, transmit the converted signals to the digital voltage controlled oscillator;

the digital voltage controlled oscillator is configured to perform the voltage controlled oscillation process to the signals transmitted by the DA converter.

3. The system according to claim 1, wherein, the digital voltage oscillation unit comprises a pulse width modulation (PWM) module and a digital voltage controlled oscillator, wherein, the PWM module is configured to: generate a PWM wave with a constant period and an adjustable high-level pulse width, and perform a pulse width modulation to the PWM wave by using the signals ahead and lag output by the digital loop filter unit, and transmit the signal after the pulse width modulation to the digital voltage controlled oscillator;

the digital voltage controlled oscillator is configured to perform the voltage controlled oscillation process to the signal transmitted by the PWM module.

4. The system according to claim 3, wherein, the PWM module is implemented by timing setting a processor of a field programmable gate array or a programmable logic device in the locking system.

5. A locking method, comprising:

a locking system performing a phase discrimination and conversion process to an input signal $F_i$ of an external standard source and a feedback output signal $F_0$ of a local thermostatic crystal oscillator which pass through a frequency division, to generate a clock signal clk and a signal sign which is used to denote a frequency size relationship between the signal $F_i$ and the signal $F_0$, and performing a filtering process to the signal clk and the signal sign, and performing a voltage controlled oscillation process to a signal ahead which is used to denote that the frequency of the signal $F_0$ is lower than the frequency of the signal $F_i$ and a signal lag which is used to denote that the frequency of the signal $F_0$ is higher than the frequency of the signal $F_i$, to implement a locking of the signal $F_0$ and the signal $F_i$;

wherein the step of the locking system performing the phase discrimination and conversion process to the signal $F_i$ and the signal $F_0$ which pass through the frequency division to generate the clock signal clk and the signal sign which is used to denote the frequency size relationship between the signal $F_i$ and the signal $F_0$ comprises:

the locking system performing a phase discrimination process to the signal $F_i$ and the signal $F_0$ at first, generating a pulse signal error which is used to denote a phase relationship between the signal $F_i$ and the signal $F_0$, calculating a pulse width of the pulse signal error according to a counting signal count, generating the signal sign which denotes the frequency size relationship between the signal $F_i$ and the signal $F_0$ and a signal equ_nequ which denotes whether neighboring pulse widths are equal, and performing an AND process to the signal equ_nequ and the signal $F_i$ to generate the clock signal clk;

wherein the counting signal count is implemented by way of a time interval calculation, and the signal sign denotes the frequency size relationship between the signal $F_i$ and the signal $F_0$ by a size relationship of neighboring pulse widths in the pulse signal error.

6. The method according to claim 5, wherein, before the step of performing the voltage controlled oscillation process to the signals ahead and lag, the method further comprises:

the locking system controlling a digital-analog conversion by using the signals ahead and lag.

7. The method according to claim 5, wherein, before the step of performing the voltage controlled oscillation process to the signals ahead and lag, the method further comprises:

the locking system performing a pulse width modulation to a pulse width modulation (PWM) wave by the signals ahead and lag.

8. The method according to claim 5, wherein, the PWM wave is a PWM wave with a constant period and an adjustable high-level pulse width, which is generated by timing setting a processor of a field programmable gate array or a programmable logic device in the locking system.

* * * * *